United States Patent
Xu et al.

(10) Patent No.: US 12,142,872 B2
(45) Date of Patent: Nov. 12, 2024

(54) THERMOCONDUCTIVE STRUCTURE OF SOCKET CONNECTOR

(71) Applicants: JESS-LINK PRODUCTS CO., LTD., New Taipei (TW); ULTRASPEED ELECTRONICS CO., LTD., Taoyuan (TW)

(72) Inventors: Ming-Jun Xu, Taoyuan (TW); Wen-Fu Liao, Taoyuan (TW); Yun-Chang Yang, New Taipei (TW); Ming-Wei Chen, New Taipei (TW)

(73) Assignees: JESS-LINK PRODUCTS CO., LTD., New Taipei (TW); ULTRASPEED ELECTRONICS CO., LTD., Taoyuan (TW)

( * ) Notice: Subject to any disclaimer, the term of this patent is extended or adjusted under 35 U.S.C. 154(b) by 385 days.

(21) Appl. No.: 17/849,547

(22) Filed: Jun. 24, 2022

(65) Prior Publication Data
US 2023/0318223 A1    Oct. 5, 2023

(30) Foreign Application Priority Data
Apr. 1, 2022    (TW) ................... 111112881

(51) Int. Cl.
*H01R 13/52*    (2006.01)
*H01R 13/514*    (2006.01)
(Continued)

(52) U.S. Cl.
CPC ........... *H01R 13/52* (2013.01); *H01R 13/514* (2013.01); *H01R 24/20* (2013.01); *H05K 7/20409* (2013.01)

(58) Field of Classification Search
CPC .. H01R 13/514; H01R 13/516; H01R 13/518; H01R 13/52; H01R 13/5202;
(Continued)

(56) References Cited

U.S. PATENT DOCUMENTS

| 2021/0285629 A1 | 9/2021 | Potucek et al. |
| 2023/0318223 A1* | 10/2023 | Xu ..................... H05K 7/20409 439/587 |

FOREIGN PATENT DOCUMENTS

| CN | 205583227 U | 9/2016 |
| CN | 108604931 A | 9/2018 |

(Continued)

OTHER PUBLICATIONS

Office Action dated Oct. 5, 2022 of the corresponding Taiwan patent application No. 111112881.

*Primary Examiner* — Khiem M Nguyen
(74) *Attorney, Agent, or Firm* — Chun-Ming Shih; HDLS IPR SERVICES

(57) ABSTRACT

A thermoconductive structure includes a waterproof casing, a socket and a thermoconductive plate. The socket is accommodated in the waterproof casing and includes a metal housing having an inserting opening and a side opening defined on a side of the inserting opening. The thermoconductive plate is movably disposed on the metal housing. One surface of the thermoconductive plate protrudes from an inner surface of the metal housing through the side opening. Another surface of the thermoconductive plate is provided with a soft thermoconductive element. The soft thermoconductive element is disposed between an inner surface of the waterproof casing and the thermoconductive plate. When a plug is inserted into the metal housing, the plug pushes the thermoconductive plate to make the soft thermoconductive element be compressed by the thermoconductive plate and the waterproof housing.

11 Claims, 11 Drawing Sheets

(51) Int. Cl.
*H01R 24/20* (2011.01)
*H05K 7/20* (2006.01)

(58) Field of Classification Search
CPC ............ H01R 13/5205; H01R 13/5208; H01R 13/5213; H01R 13/5219; H01R 24/00; H01R 24/20; H01R 24/22; H01R 24/28; H01R 24/30; H05K 7/20409; H05K 7/20418
USPC ......................................................... 439/187
See application file for complete search history.

(56) References Cited

FOREIGN PATENT DOCUMENTS

| | | |
|---|---|---|
| CN | 212433458 U | 1/2021 |
| JP | 2009152427 A | 7/2009 |
| TW | M631793 U | 9/2022 |

\* cited by examiner

THERMOCONDUCTIVE STRUCTURE OF SOCKET CONNECTOR

BACKGROUND

Technical Field

The disclosure relates to an electric connector, particularly to a socket connector in an immersed heat dissipation manner.

Related Art

An optical fiber transceiver is one of the key components of the optical fiber communication system. An optical fiber transceiver can convert electric signals and optical signals to transmit information. Conversion of electric signals and optical signals also releases heat. Increasing of transmission speed of an optical fiber transceiver also makes heat being released increase. Thus, the outer surface of an optical fiber transceiver also needs to be equipped with a cooling mechanism such as fins. With the development and maturity of immersion cooling systems using dielectric fluids, immersion cooling systems can also be applied to the cooling of optical fiber transceivers. However, the optical fiber transceiver needs to be installed at the boundary between the dry and wet space for easy plugging and unplugging, and its waterproof property and thermal conductivity are both issues to be improved in the technical field.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

The disclosure provides a socket connector in an immersed heat dissipation manner. The disclosure provides a thermoconductive structure of a socket connector, which includes a waterproof casing, a socket and a thermoconductive plate. The socket is accommodated in the waterproof casing and includes a metal housing having an inserting opening and a side opening defined on a side of the inserting opening. The thermoconductive plate is movably disposed on the metal housing. One surface of the thermoconductive plate protrudes from an inner surface of the metal housing through the side opening. Another surface of the thermoconductive plate is provided with a soft thermoconductive element. The soft thermoconductive element is disposed between an inner surface of the waterproof casing and the thermoconductive plate. When a plug is inserted into the metal housing, the plug pushes the thermoconductive plate to make the soft thermoconductive element be compressed by the thermoconductive plate and the waterproof housing.

In the thermoconductive structure of the disclosure, the waterproof casing has a passing opening aligned with the inserting opening. The metal housing passes through the passing opening.

In the thermoconductive structure of the disclosure, an outer wall of the waterproof casing is disposed with multiple cooling fins. The soft thermoconductive element is arranged corresponding to the cooling fins in position.

In the thermoconductive structure of the disclosure, the metal housing is provided with an elastic member connected with the thermoconductive plate to push the thermoconductive plate to return. The elastic member is attached outside the metal housing, a flexible arm is extended from the elastic member, and the flexible arm presses the thermoconductive plate.

In the thermoconductive structure of the disclosure, the thermoconductive plate is movably disposed outside the metal housing, the thermoconductive plate includes a protrusive stage protruding from the inner surface of the metal housing through the side opening. The thermoconductive plate is formed with a recess opposite to the protrusive stage, and the thermoconductive element is received in the recess. A side of the protrusive stage is formed with a guide ramp, and the guide ramp faces the inserting opening.

In the thermoconductive structure of the disclosure, the thermoconductive plate is formed with a guide ramp protruding inside the metal housing, and the guide ramp faces the inserting opening.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
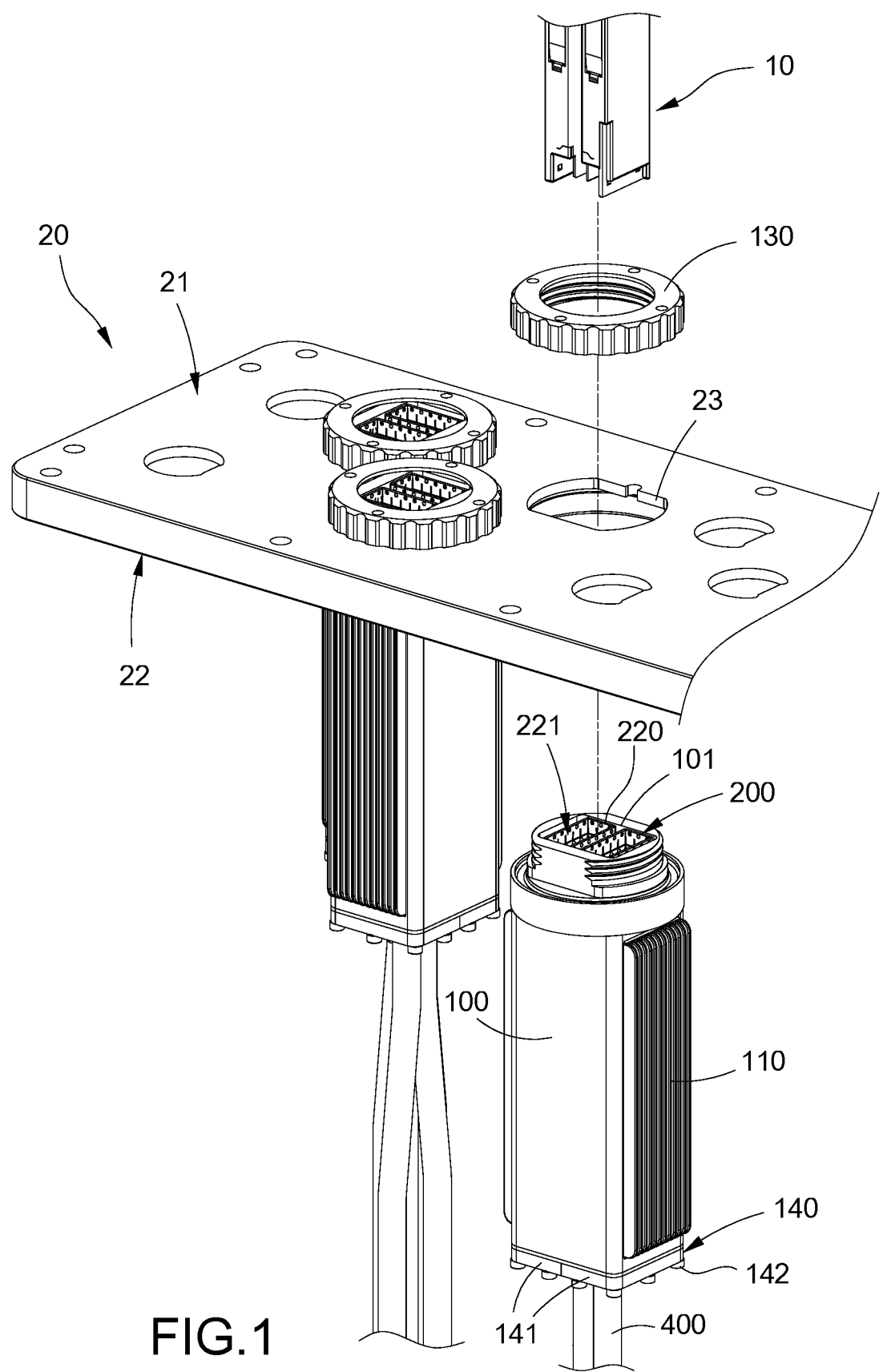
FIGS. 1 and 2 are perspective schematic views of the socket connector of an embodiment of the disclosure.
Figure 2:
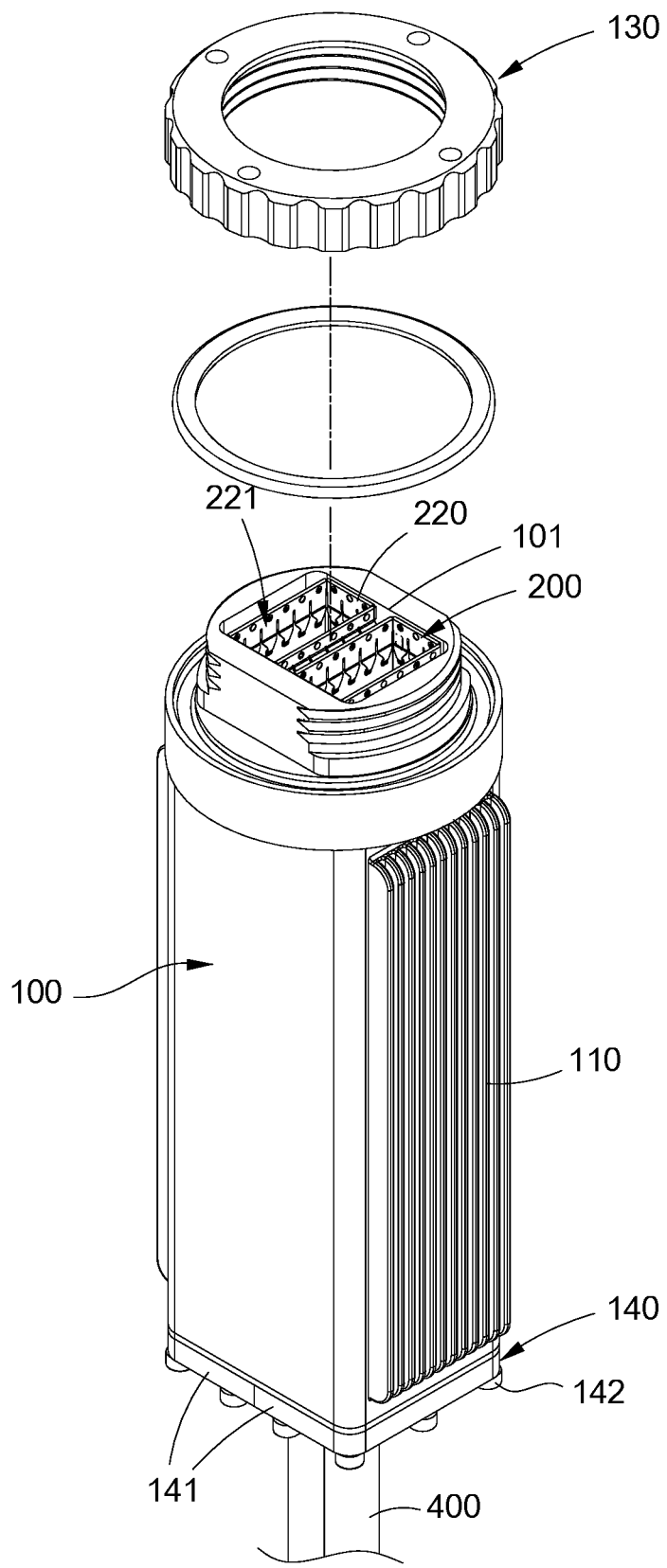

Please refer to FIGS. 1-2. The disclosure provides a socket connector in an immersed heat dissipation manner, which is installed on a partition 20 for being inserted by a plug 10. In detail, the partition 20 is part of a water tank, so a side of the partition 20 is located on a dry side 21 outside the water tank and the other side of the partition is located on a wet side 22 inside the water tank. The partition 20 is formed with an installing hole 23 penetrating through the partition 20.

Figure 3:
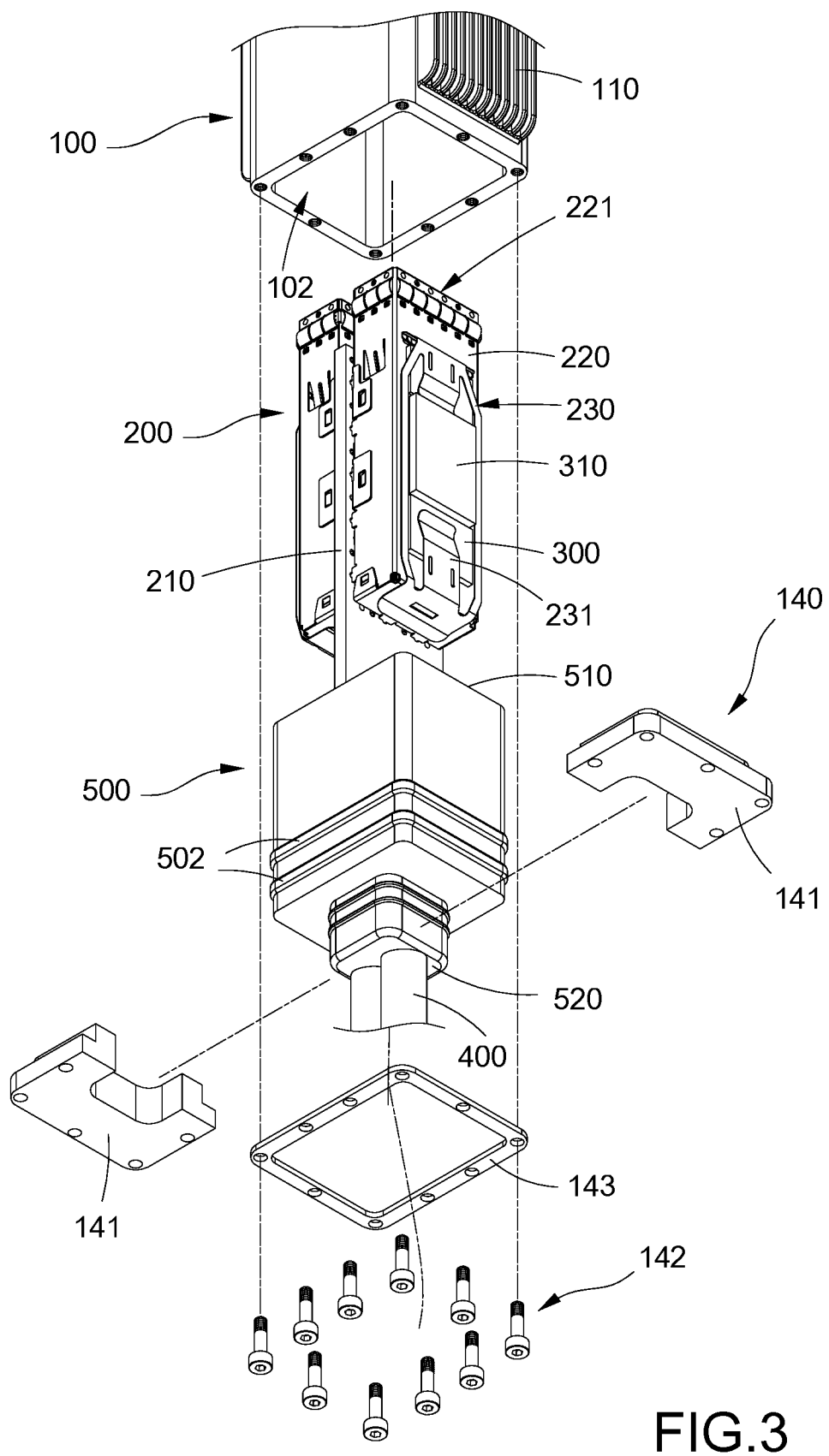
FIGS. 3 and 4 are exploded views of the socket connector of an embodiment of the disclosure.
Figure 4:
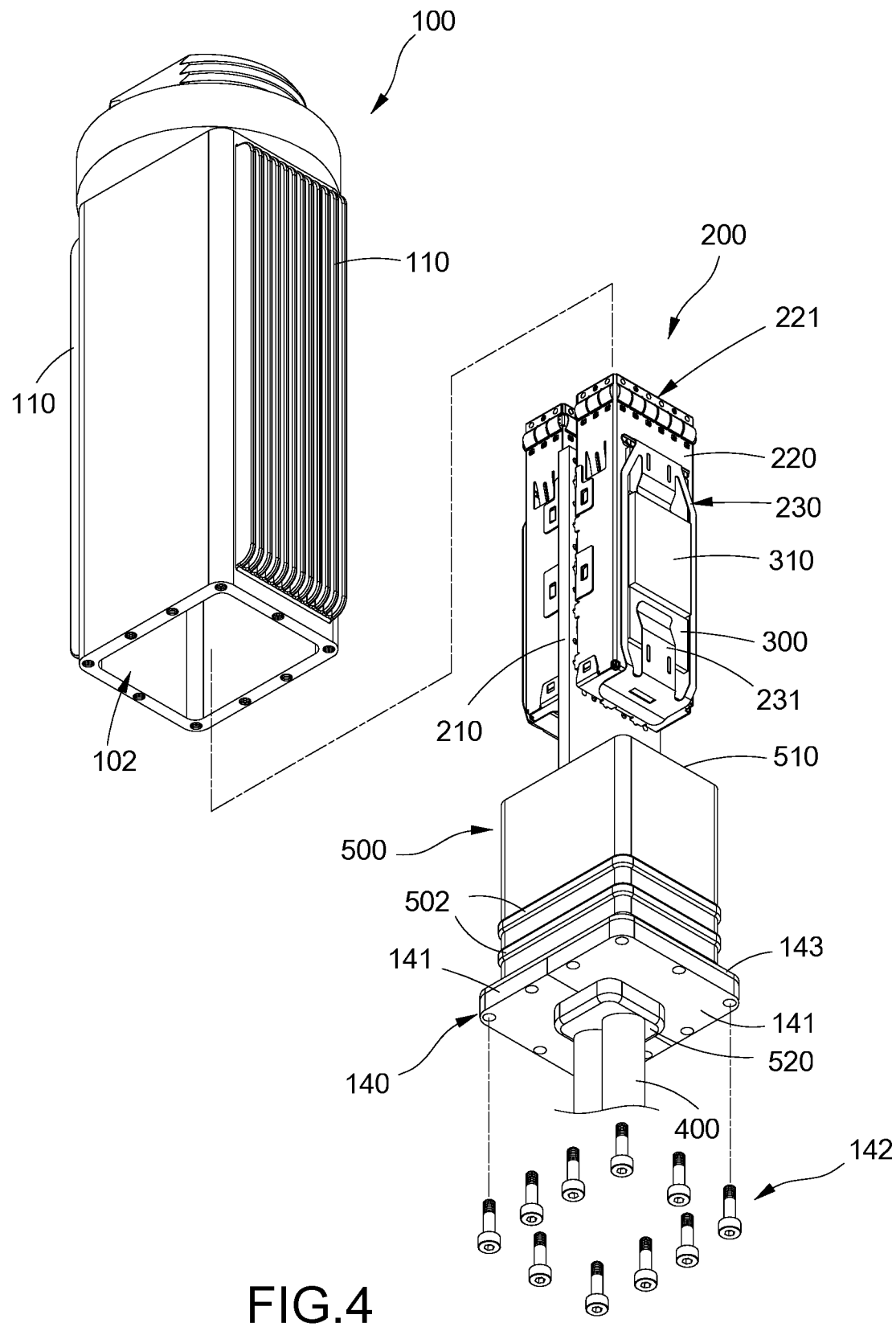
Figure 5:
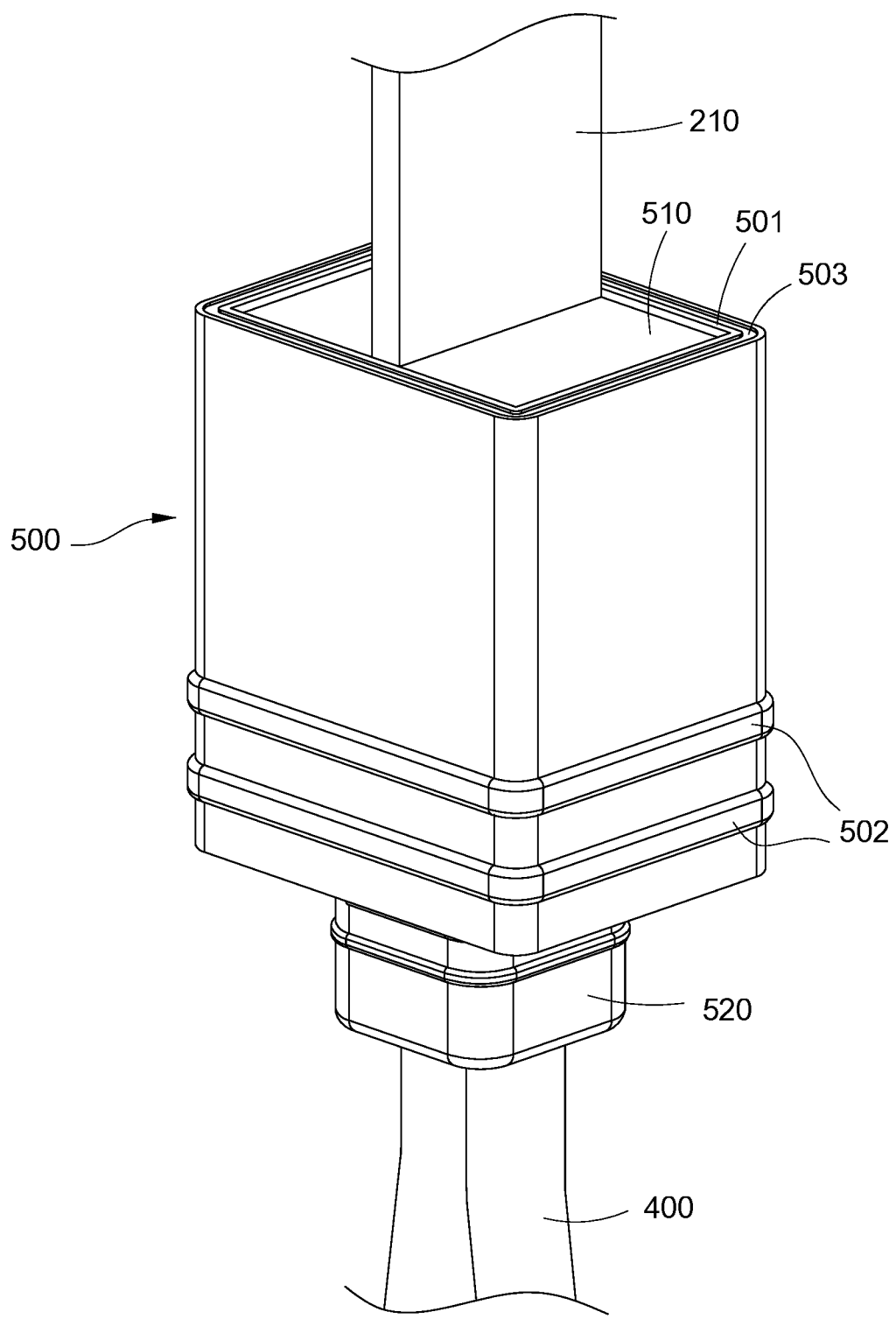
FIG. 5 is a perspective schematic view of the waterproof plug of the socket connector of an embodiment of the disclosure.
Figure 6:
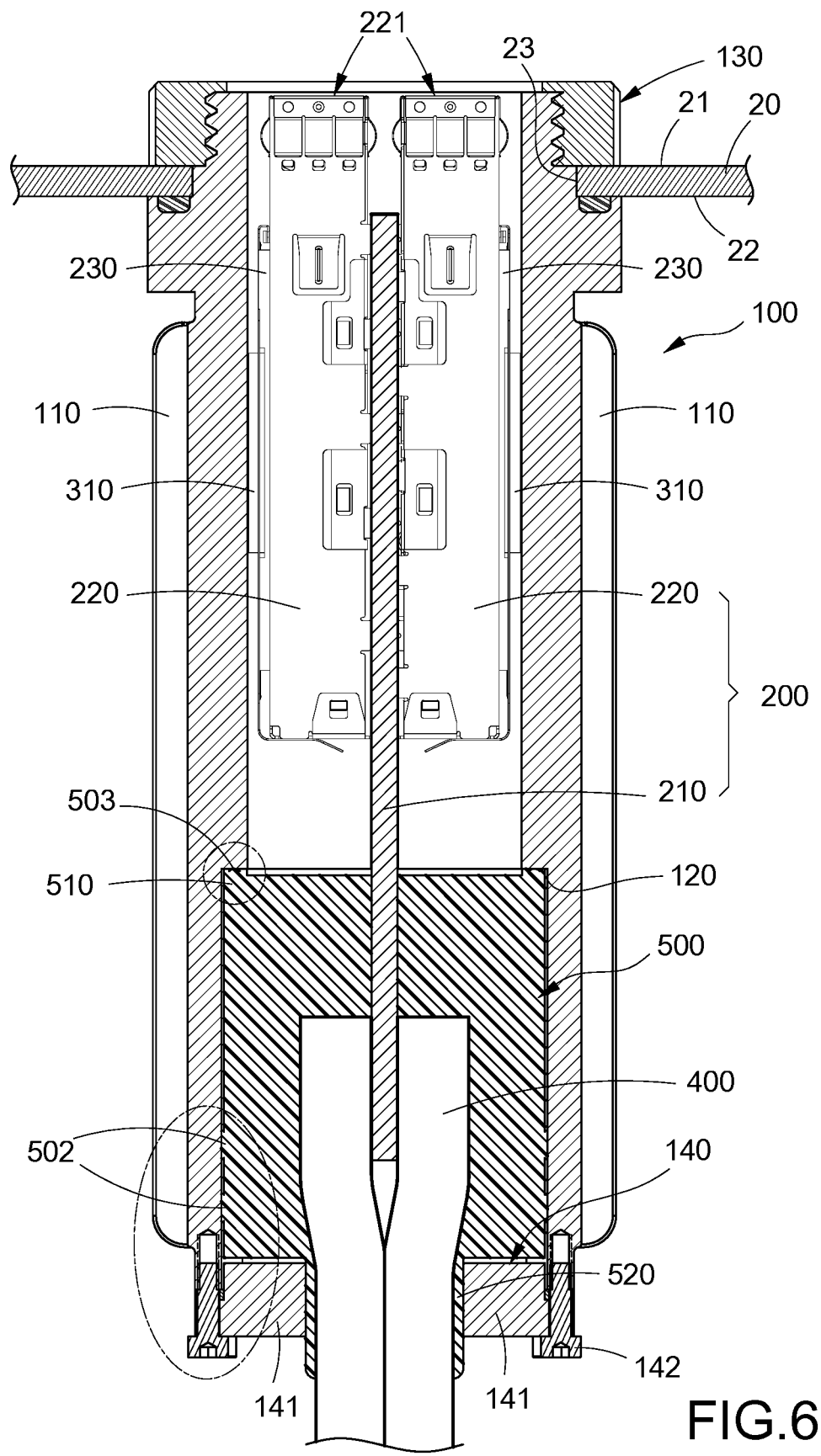
FIG. 6 is a longitudinal cross-sectional view of the socket connector of an embodiment of the disclosure.
Figure 7:
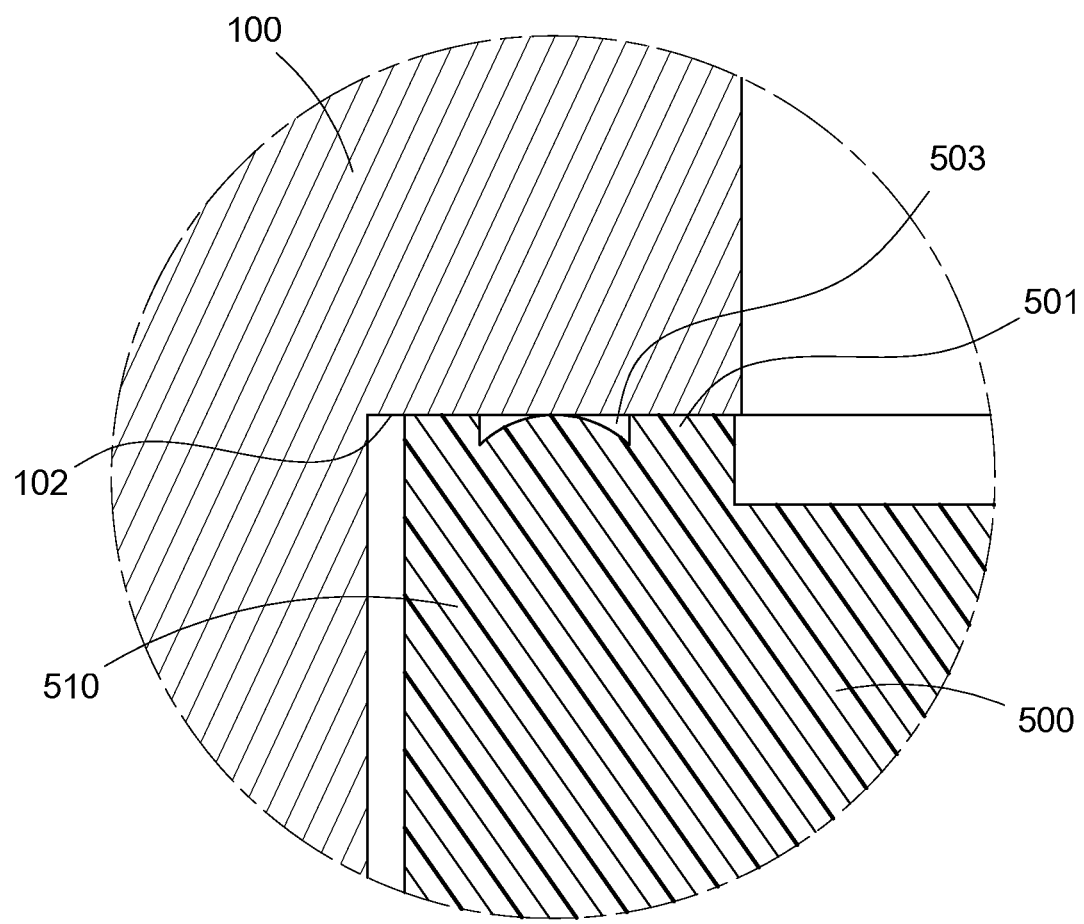
FIGS. 7 and 8 are partially enlarged views of FIG. 6.
Figure 8:
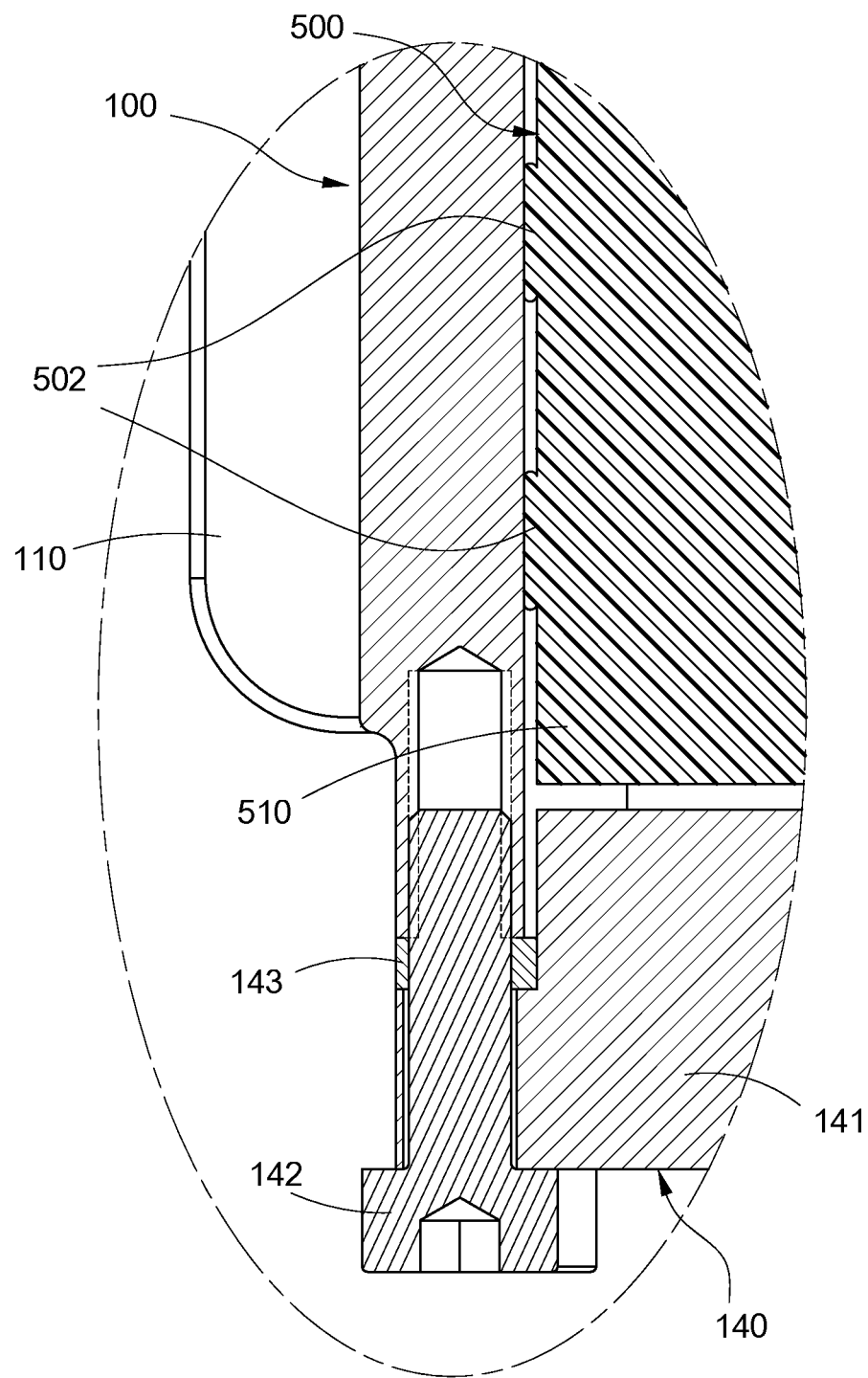

Please refer to FIGS. 2-4. The socket connector of the disclosure includes a waterproof casing 100, a socket 200, a thermoconductive plate 300, a wire 400 and a waterproof plug 500.

Please refer to FIGS. 1-4. In the embodiment, the waterproof casing 100 is of a rod (or bar) shape, which is inserted in the installing hole 23 of the partition 20. An end of the waterproof casing 100 has a passing opening 101 to be an open shape. The passing opening 101 is located on the dry side 21 of the partition 20. This end of the waterproof casing 100 is screwed with a pressing ring 130 for fastening the waterproof casing 100 onto the partition 20. The other end of the waterproof casing 100 has a wiring opening 102 located on the wet side 22 of the partition 20. The wiring opening 102 is provided with an end cap 140 for sealing the wiring opening 102. A waterproof gasket 143 is clamped between the end cap 140 and an outer edge of the wiring opening 102. Thus, the inside of the waterproof casing 100 communicates with the dry side 21 of the partition 20 and is isolated from the wet side 20 of the partition 20. The inner side of the waterproof casing 100 is protruded with an annular step 120 facing the wiring opening 102. The outer surface of the waterproof casing 100 is disposed with multiple cooling fins 110, so the cooling fins 110 are exposed on the wet side 22 of the partition 20.

The socket 200 is accommodated in the waterproof casing 100 and includes a circuit board 210 and at least one metal housing 220 attached on the circuit board 210. In the embodiment, the socket 200 includes two identical metal housings 220. The two metal housings 220 are symmetrically attached on two surfaces of the circuit board 210, respectively. In the following description, one metal housing 220 is mentioned as an example. In the embodiment, the metal housing 220 is of a rod (or bar) shape. An end of the metal housing 220 has an inserting opening 221 and a side of the metal housing 220 is formed with a side opening 222. The metal housing 220 is disposed in the waterproof casing 100 and passes through the passing opening 101 of the waterproof casing 100 so as to make the inserting opening 221 align with the passing opening 101 for allowing the plug 10 to be inserted into the socket 200 from the dry side 21 of the partition 20.

Please refer to FIGS. 3-4 and 9-11. The thermoconductive structure of the disclosure is described as follows.

The thermoconductive plate 300 is movably disposed outside the metal housing 220.

One surface of the thermoconductive plate 300 protrudes from an inner surface of the metal housing 220 through the side opening 222. The other surface of the thermoconductive plate 300 is provided with a soft thermoconductive element 310. In the embodiment, the soft thermoconductive element 310 is thermal paste or thermal pad made of paste mixed with metal powder. In detail, the thermoconductive plate 300 has a protrusive stage 301 protruding from the inner surface of the metal housing 220 through the side opening 222. The thermoconductive plate 300 is formed with a recess 302 corresponding to the protrusive stage 301 in position. The soft thermoconductive element 310 is received in the recess 302. The soft thermoconductive element 310 is disposed between the inner surface of the waterproof casing 100 and the thermoconductive plate 300 (the soft thermoconductive element 310 separates from the inner surface of the waterproof casing 100, that is, the soft thermoconductive element 310 does not contact the inner surface of the waterproof casing 100 before the socket 200 being inserted) to allow the socket 200 to be inserted into the waterproof casing 100 when assembling. The thermoconductive plate 300 is formed with a guide ramp 303 disposed on a side of the protrusive stage 301 to protrude inside the metal housing 220. The guide ramp 303 is disposed facing the inserting opening 221.

Figure 9:
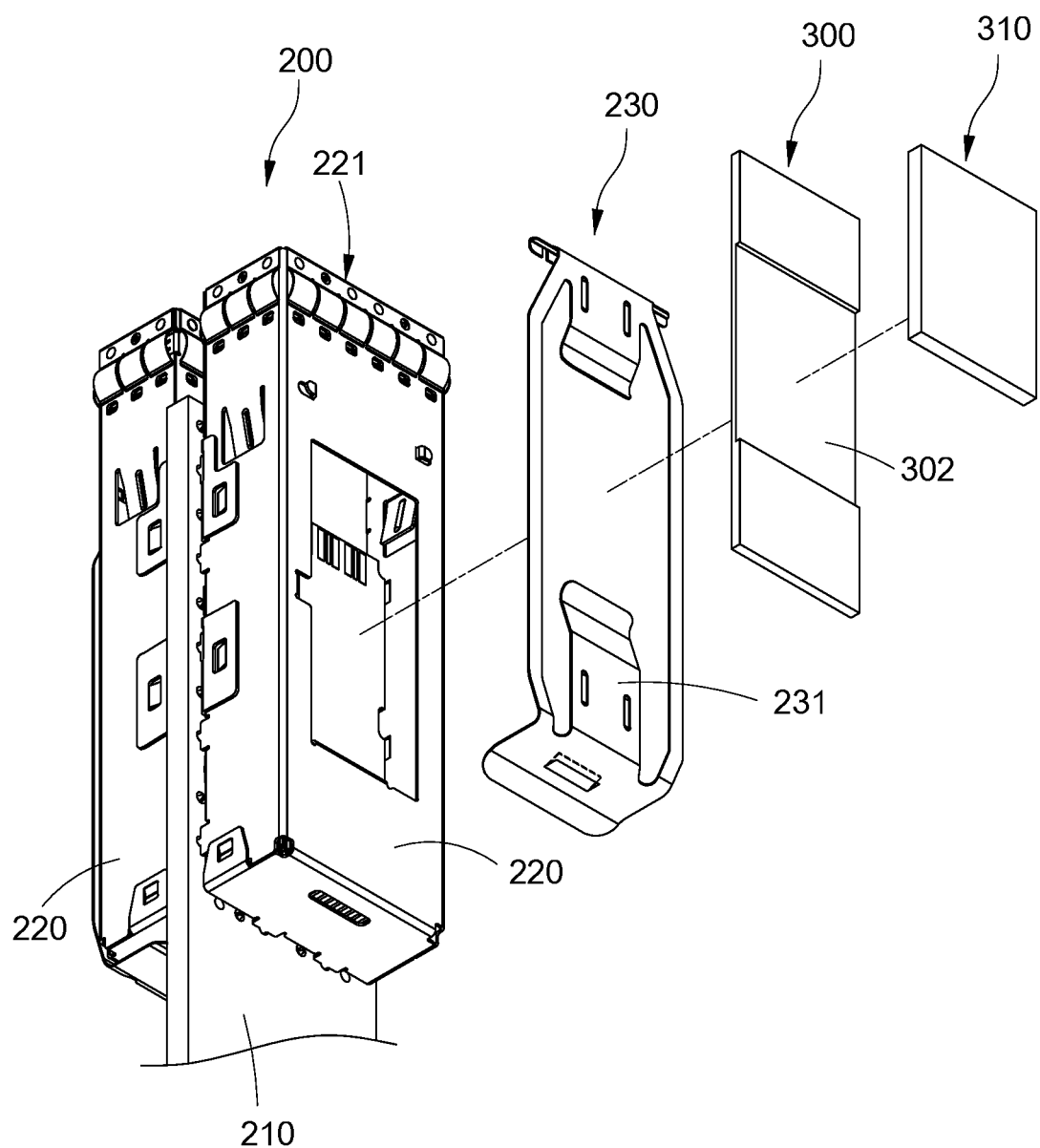
FIG. 9 is a schematic view of the thermoconductive plate of the socket connector of an embodiment of the disclosure.
Figure 10:
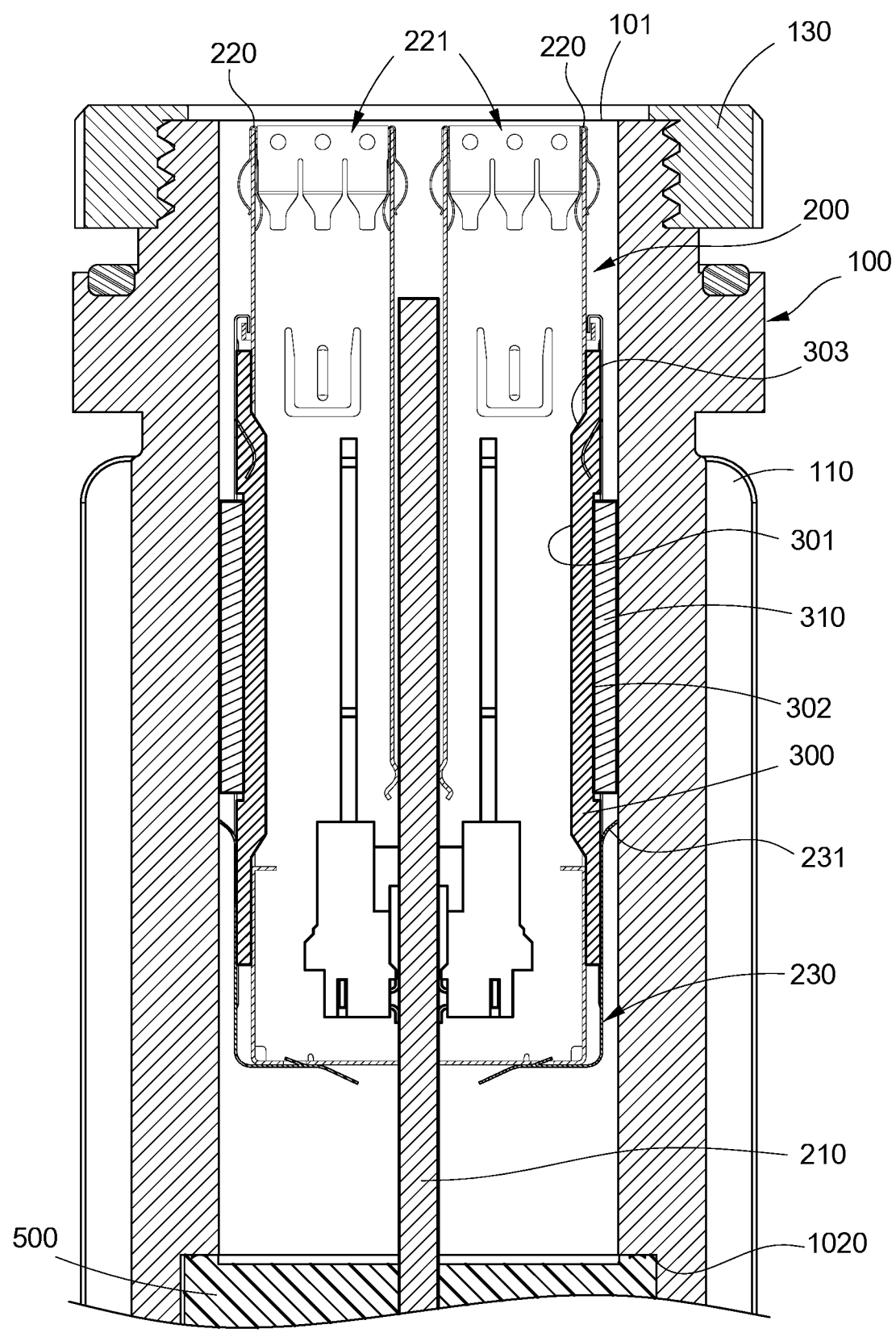
FIGS. 10 and 11 are schematic views of the thermoconductive plate of the socket connector of an embodiment of the disclosure in a using status.
Figure 11:
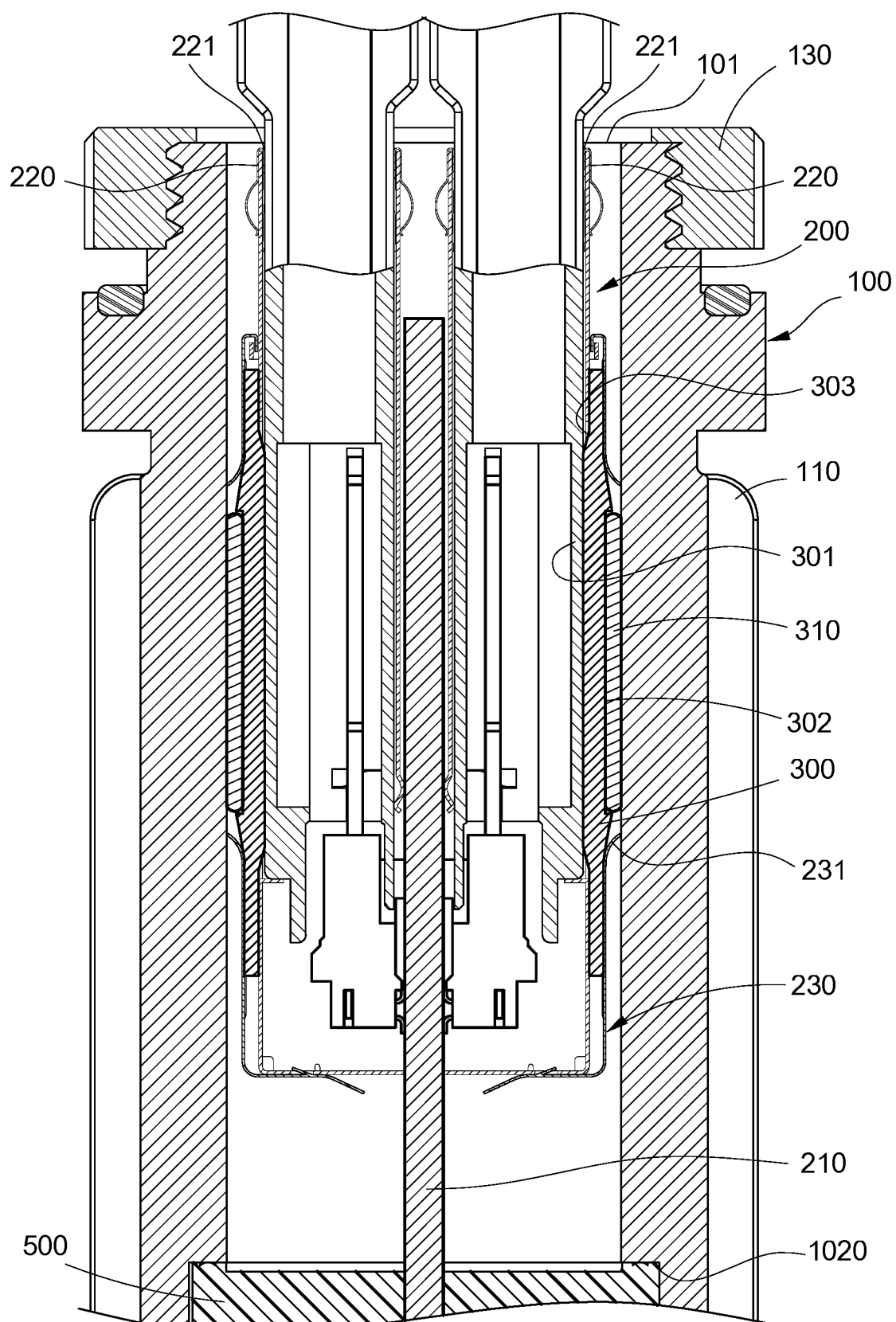

Please refer to FIGS. 9-11. When the plug 10 is inserted into the metal housing 220, the plug 10 pushes the thermoconductive plate 300 via the protrusive stage 301, the plug 10 presses the protrusive stage 301 to be thermally connected with the thermoconductive plate 300, and the guide ramp 303 makes the plug 10 to easily push the protrusive stage 301. The thermoconductive plate 300 is pushed to move away from the metal housing 220 to make the soft thermoconductive element 310 be compressed by the thermoconductive plate 300 and the waterproof housing 100 to further make the thermoconductive plate 300 be thermally connected with the waterproof casing 100. In some embodiments, the soft thermoconductive element 310 is arranged corresponding to the cooling fins 110 in position, so the thermoconductive plate 300 is thermally connected with the cooling fins 110 when the plug 10 is inserted into the metal housing 220.

The metal housing 220 is provided with an elastic member 230 connected with the thermoconductive plate 300. The elastic member 230 may push the thermoconductive plate 300 to return when the plug 10 is removed. In detail, the elastic member 230 is a metal frame 141 attached outside the metal housing 220. A flexible arm 231 is extended from the elastic member 230. The flexible arm 231 presses the thermoconductive plate 300 to push the thermoconductive plate 300 into the metal housing 220.

Please refer to FIGS. 3-8. The waterproof of the disclosure is described as follows.

An end of the wire 400 is connected to the circuit board 210 of the socket 200. The wire 400 passes the waterproof casing 100 through the wiring opening 102 to reach in the water tank. The waterproof plug 500 covers a section of the wire 400. In detail, the waterproof plug 500 covers the junction of the wire 400 and the circuit board 210. The waterproof plug 500 is disposed in the wiring opening 102 to close the wiring opening 102. The waterproof plug 500 has an inner end 510 and an outer end 520 opposite to the inner end 510. The inner end 510 of the waterproof plug 500 is arranged to face the socket 200 and formed with a longitudinal annular rib 501. The end cap 140 is fastened to the waterproof casing 100 along a longitudinal direction of the waterproof plug 500 to press the outer end 520 to make the longitudinal annular rib 501 press the annular step 120 for sealing. The inner end 510 of the waterproof plug 500 is formed with an annular groove 503. The annular step 120 seals the annular groove 503. A waterproof adhesive may be filled in the annular groove 503 for sealing. An outer surface of the waterproof plug 500 is formed with a transverse annular rib 502 that transversely and annularly abuts against the inner surface of the waterproof casing 100 for sealing.

In detail, the end cap 140 includes multiple frame bodies 141. The frame bodies 141 are connected with each other to form a through hole 103 for being passed by the waterproof plug 500. Each frame body 141 is fastened to the waterproof casing 100 along a longitudinal direction of the waterproof plug 500. Thus, when the frame bodies 141 are assembled, an inner surface of the through hole 103 shrinks inward to tightly bind an outer surface of the waterproof plug 500 for sealing.

While this disclosure has been described by means of specific embodiments, numerous modifications and variations could be made thereto by those skilled in the art without departing from the scope and spirit of this disclosure set forth in the claims.

What is claimed is:

1. A thermoconductive structure of a socket connector, the socket connector applied to a plug, the thermoconductive structure comprising:
   a waterproof casing,
   a socket, accommodated in the waterproof casing, comprising a metal housing, the metal housing comprising an inserting opening and a side opening defined on one side of the inserting opening; and
   a thermoconductive plate, movably disposed on the metal housing, one surface of the thermoconductive plate protruding from an inner surface of the metal housing through the side opening, another surface of the thermoconductive plate provided with a soft thermoconductive element, and the soft thermoconductive element disposed between an inner surface of the waterproof casing and the thermoconductive plate;

wherein when the plug is inserted into the metal housing, the plug pushes the thermoconductive plate to make the soft thermoconductive element be compressed by the thermoconductive plate and the waterproof housing.

2. The thermoconductive structure of claim 1, wherein the waterproof casing comprises a passing opening aligned with the inserting opening.

3. The thermoconductive structure of claim 1, wherein the metal housing passes through the passing opening.

4. The thermoconductive structure of claim 1, wherein multiple cooling fins are disposed on an outer wall of the waterproof casing.

5. The thermoconductive structure of claim 4, wherein the soft thermoconductive element is arranged corresponding to the cooling fins in position.

6. The thermoconductive structure of claim 1, wherein the metal housing comprises an elastic member connected with the thermoconductive plate to push the thermoconductive plate to return.

7. The thermoconductive structure of claim 6, wherein the elastic member is attached outside the metal housing, a flexible arm is extended from the elastic member, and the flexible arm presses the thermoconductive plate.

8. The thermoconductive structure of claim 1, wherein the thermoconductive plate is movably disposed outside the metal housing, the thermoconductive plate comprises a protrusive stage protruding from the inner surface of the metal housing through the side opening.

9. The thermoconductive structure of claim 8, wherein the thermoconductive plate comprises a recess disposed oppositely to the protrusive stage, and the soft thermoconductive element is received in the recess.

10. The thermoconductive structure of claim 9, wherein a guide ramp is disposed on a side of the protrusive stage, and the guide ramp is disposed facing the inserting opening.

11. The thermoconductive structure of claim 1, wherein the thermoconductive plate comprises a guide ramp protruding inside the metal housing, and the guide ramp is disposed facing the inserting opening.

* * * * *